(12) United States Patent
Zhou et al.

(10) Patent No.: US 11,289,687 B2
(45) Date of Patent: Mar. 29, 2022

(54) ORGANIC LIGHT EMITTING DIODE (OLED) DISPLAY PANEL AND ELECTRONIC DEVICE

(71) Applicant: Wuhan China Star Optoelectronics Semiconductor Display Technology Co., LTD., Wuhan (CN)

(72) Inventors: Yang Zhou, Wuhan (CN); Mugyeom Kim, Wuhan (CN); Yong Zhao, Wuhan (CN)

(73) Assignee: Wuhan China Star Optoelectronics Semiconductor Display Technology Co., LTD., Wuhan Hubei (CN)

( * ) Notice: Subject to any disclaimer, the term of this patent is extended or adjusted under 35 U.S.C. 154(b) by 195 days.

(21) Appl. No.: 16/633,313

(22) PCT Filed: Oct. 31, 2019

(86) PCT No.: PCT/CN2019/114778
§ 371 (c)(1),
(2) Date: Jan. 23, 2020

(87) PCT Pub. No.: WO2021/000474
PCT Pub. Date: Jan. 7, 2021

(65) Prior Publication Data
US 2021/0005849 A1    Jan. 7, 2021

(30) Foreign Application Priority Data
Jul. 4, 2019 (CN) .......................... 201910598928.7

(51) Int. Cl.
*H01L 51/56* (2006.01)
*H01L 27/32* (2006.01)

(52) U.S. Cl.
CPC .......... *H01L 51/56* (2013.01); *H01L 27/3234* (2013.01); *H01L 2251/301* (2013.01); *H01L 2251/5338* (2013.01)

(58) Field of Classification Search
None
See application file for complete search history.

(56) References Cited

U.S. PATENT DOCUMENTS 10,541,380 B1 *  1/2020  Sung ................... H01L 51/0097
2014/0339517 A1  11/2014  Park et al.
2014/0339527 A1  11/2014  Okada et al.
(Continued)

FOREIGN PATENT DOCUMENTS

CN    104167424 A    11/2014
CN    105609530 A    5/2016
(Continued)

*Primary Examiner* — J. E. Schoenholtz
(74) *Attorney, Agent, or Firm* — Pv IP PC; Wei Te Chung; Ude Lu (57) ABSTRACT

An organic light emitting diode (OLED) display panel and an electronic device are provided. The OLED display panel includes a flexible polymer substrate, a first inorganic layer, a second inorganic layer, and an OLED array layer; the first inorganic layer and the second inorganic layer formed over opposite surfaces of the flexible polymer substrate, and the OLED array layer formed on a side of the first inorganic layer away from the flexible polymer substrate.

13 Claims, 4 Drawing Sheets

(56) References Cited

U.S. PATENT DOCUMENTS

| | | | |
|---|---|---|---|
| 2016/0141551 A1* | 5/2016 | Seo | ..................... H01L 51/5253 |
| | | | 257/40 |
| 2017/0104048 A1* | 4/2017 | Chung | ................ H01L 27/3262 |
| 2017/0104178 A1 | 4/2017 | Okada et al. | |
| 2018/0090697 A1 | 3/2018 | Xu | |
| 2018/0342707 A1* | 11/2018 | Lee | ..................... H01L 27/3258 |
| 2019/0245159 A1* | 8/2019 | Kim | ................... H01L 27/3246 |
| 2020/0127233 A1* | 4/2020 | Sung | ................ H01L 21/76205 |

FOREIGN PATENT DOCUMENTS

| | | |
|---|---|---|
| CN | 105655494 A | 6/2016 |
| CN | 109860266 A | 6/2019 |

\* cited by examiner

ORGANIC LIGHT EMITTING DIODE (OLED) DISPLAY PANEL AND ELECTRONIC DEVICE

FIELD OF INVENTION

The present application relates to the field of display technologies, and in particular to an organic light emitting diode (OLED) display panel and an electronic device.

BACKGROUND

Mobile phones are one of the indispensable products in people's daily lives. Presently, mobile phones using flexible organic light emitting diode (OLED) display panels have an advantage of being foldable. However, as flexible polymer substrate of flexible OLED display panels has poor moisture and oxygen barrier properties, the organic light emitting diode OLED layer and the active cathode in the OLED are easily corroded, resulting in shortened service life of mobile phones.

Therefore, it is necessary to provide a technical solution to solve the problem of shortened service life of mobile phones due to poor moisture and oxygen barrier properties of the flexible polymer substrate of the flexible OLED display panel.

SUMMARY

The purpose of the present application is to provide an organic light emitting diode (OLED) display panel and an electronic device, which have good performance in blocking moisture and oxygen.

To achieve the above purpose, the present application provides an electronic device comprising an organic light emitting diode (OLED) display panel. The OLED display panel comprises a flexible polymer substrate, a first inorganic layer, a second inorganic layer, and an organic light emitting diode (OLED) array layer. The first inorganic layer and the second inorganic layer are formed over opposite surfaces of the flexible polymer substrate, and the OLED array layer is formed on a side of the first inorganic layer away from the flexible polymer substrate.

In the above electronic device, the organic light emitting diode display panel further comprises an organic layer formed on a side of the second inorganic layer away from the flexible polymer substrate.

In the above electronic device, the OLED display panel comprises at least one photosensitive region, and the photosensitive region of the OLED display panel is formed with a recess, and the recess penetrates a portion of the organic layer along a first direction in which a direction that the organic layer facing the flexible polymer substrate.

In the above electronic device, the recess penetrates through the entire organic layer along the first direction, or the recess penetrates through the entire organic layer and a portion of the second inorganic layer along the first direction.

In the above electronic device, the electronic device further comprises an optical sensor disposed in the recess, and the optical sensor having a size along the first direction that is less than or equal to a depth of the recess along the first direction.

In the above electronic device, the OLED display panel further comprises a display region, and the display region is disposed at a periphery of the photosensitive region or the photosensitive region overlaps the display region.

In the above electronic device, the flexible polymer substrate and the organic layer are both polyimide layers, and the polyimide layer has a light transmittance greater than or equal to 90%.

In the above electronic device, the second inorganic layer comprises a stacked layer of a first silicon oxide layer and an amorphous silicon layer, and the amorphous silicon layer is disposed between the first silicon oxide layer and the organic layer.

In the above electronic device, the polyimide layer is formed by imidizing a polyamic acid solution in a heating chamber after coating the polyamic acid solution, and an oxygen volume content in the heating chamber is less than or equal to 100 ppm.

In the above electronic device, the first inorganic layer comprises a stacked layer of at least one silicon oxide layer and at least one silicon nitride layer, and the second silicon oxide layer is located on one side adjacent to the flexible polymer substrate.

An organic light emitting diode (OLED) display panel, comprising a flexible polymer substrate; a first inorganic layer; a second inorganic layer; and an organic light emitting diode (OLED) array layer. The first inorganic layer and the second inorganic layer are formed on opposite surfaces of the flexible polymer substrate, and the OLED array layer is formed on a side of the first inorganic layer away from the flexible polymer substrate.

In the above OLED display panel, the OLED display panel further comprises an organic layer formed on one side of the second inorganic layer away from the flexible polymer substrate.

In the above OLED display panel, the OLED display panel further comprises at least one photosensitive region, and the photosensitive region of the OLED display panel is formed with a recess. The recess penetrates at least a portion of the organic layer along a first direction in which a direction that the organic layer facing the flexible polymer substrate.

In the above OLED display panel, the recess penetrates the entire organic layer along the first direction, or the recess penetrates the entire organic layer and a portion of the second inorganic layer along the first direction.

In the above OLED display panel, the OLED display panel further comprises a display region, wherein the display region is disposed at a periphery of the photosensitive region, or the photosensitive region overlaps the display region.

In the above OLED display panel, the flexible polymer substrate and the organic layer are both polyimide layers, and the polyimide layer has a transmittance greater than or equal to 90%.

In the above OLED display panel, the polyimide layer is formed by imidizing a polyamic acid solution in a heating chamber after the polyamic acid solution is coated, and an oxygen volume content in the heating chamber is less than or equal to 100 ppm.

In the above OLED display panel, the second inorganic layer comprises a stacked layer of a first silicon oxide layer and an amorphous silicon layer, and the amorphous silicon layer is disposed between the first silicon oxide layer and the organic layer.

In the above OLED display panel, the first inorganic layer comprises a stacked layer of at least one silicon oxide layer and at least one silicon nitride layer, wherein the second silicon oxide layer is located on one side adjacent to the flexible polymer substrate.

The present application provides an organic light emitting diode (OLED) display panel and an electronic device. The OLED display panel comprises a flexible polymer substrate, a first inorganic layer, a second inorganic layer, and an organic light emitting diode (OLED) array layer; the first inorganic layer and the second inorganic layer formed over opposite surfaces of the flexible polymer substrate, and the organic light emitting diode array layer formed on a side of the first inorganic layer away from the flexible polymer substrate. Through respectively forming an inorganic layer on opposite surfaces of the flexible polymer substrate, the flexible polymer substrate and the inorganic layer on the opposite surfaces thereof as a whole have high barrier properties against moisture and oxygen. Moisture and oxygen can be prevented from corroding active cathode and organic light emitting layer of the OLED array layer, thereby improving the service life of the organic light emitting diode display panel and the electronic device.

DETAILED DESCRIPTION

In order to clearly and completely illustrate technical solutions in embodiments of the present invention, the following description will refer to the drawings in the embodiments of the present invention. Obviously, the described embodiments are only a part of the embodiments of the present invention, and not all the embodiments. All other embodiments obtained by a person skilled in the art based on the embodiments of the present invention without creative efforts are within the scope of the present invention.

Figure 1:
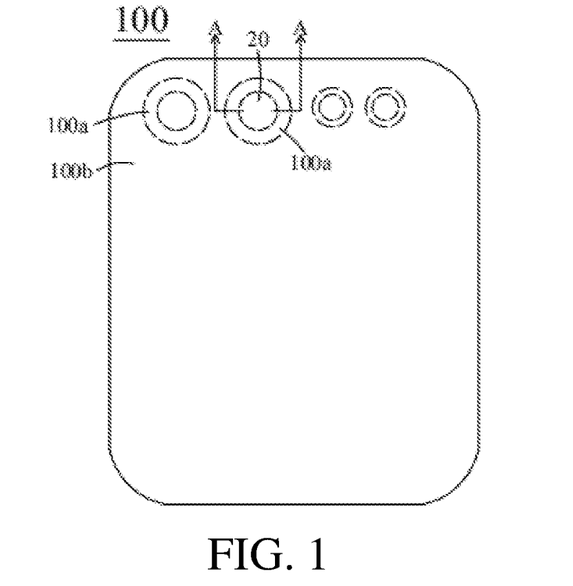
FIG. 1 is a schematic plan view of an electronic device according to a first embodiment of the present application.
Figure 2:
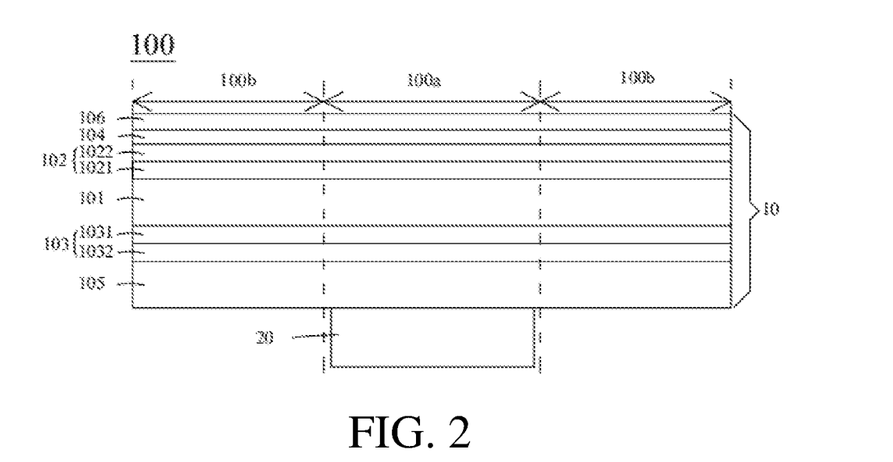
FIG. 2 is a first cross-sectional view along line A-A of the electronic device shown in FIG. 1.

Referring to FIG. 1 and FIG. 2, FIG. 1 is a schematic plan view of an electronic device according to a first embodiment of the present application, and FIG. 2 is a first cross-sectional view along a line A-A of the electronic device shown in FIG. 1. The electronic device 100 is a smart mobile terminal. The electronic device 100 comprises an organic light emitting diode (OLED) display panel 10 and an optical sensor 20. The optical sensor 20 comprises a camera, an infrared (IR) sensor, a distance sensor, a fingerprint recognition sensor, and the like. The OLED display panel 10 comprises a flexible polymer substrate 101, a first inorganic layer 102, a second inorganic layer 103, and an OLED array layer 104.

The first inorganic layer 102 and the second inorganic layer 103 are formed over opposite surfaces of the flexible polymer substrate 101. The OLED array layer 104 is formed on a side of the first inorganic layer 102 away from the flexible polymer substrate 101. The first inorganic layer 102 and the second inorganic layer 103 have good compactness to block moisture and oxygen, and the flexible polymer substrate 101 has good flexibility. The first inorganic layer 102, the second inorganic layer 103, and the flexible polymer substrate 101 as a whole has good flexibility and barrier property, and can thus prevent active cathode and organic light emitting material of the OLED array layer from corrosion caused by moisture and oxygen to improve the service life of the electronic device.

The flexible polymer substrate 101 supports the organic light emitting diode array layer 104. The flexible polymer substrate 101 is a polyimide (PI) layer. The polyimide layer has a light transmittance of greater than or equal to 90%. The polyimide layer is typically formed by imidizing a polyamic acid solution in a heating chamber after the polyamic acid solution is coated. A volume percentage of oxygen in the heating chamber is less than or equal to 100 ppm to make a light transmittance of the formed polyimide layer be greater than or equal to 90%, and prevent the formed polyimide layer from turning yellow and causing low light transmittance, thereby affecting the receiving effect on optical signals of the optical sensor 20 at a side of the flexible polymer substrate 101. That is, once light transmittance of the polyimide layer is greater than or equal to 90%, it is advantageous for improving the reception of the optical signals by the optical sensor 20. Furthermore, during formation of polyimide by imidizing the polyamic acid, a temperature of the heating chamber is raised from 120° C. to 450° C. after a first period of time, and is maintained at 450° C. for a second period of time, and is cooled down to 120° C. for a third period of time.

The first inorganic layer 102 comprises a stacked layer of at least one second silicon oxide layer 1021 and at least one silicon nitride layer 1022, and the second silicon oxide layer 1021 is located on a side close to the flexible polymer substrate 101. Specifically, the first inorganic layer 102 is a stacked layer of the second silicon oxide layer 1021 and the silicon nitride layer 1022, and the second silicon oxide layer 1021 is located on the side close to the flexible polymer substrate 101 to block moisture and oxygen and increase adhesion between the first inorganic layer 102 and the flexible polymer substrate 101 at the same time. In addition, the silicon nitride layer 1022 has a better performance for blocking moisture and oxygen than the second silicon oxide layer 1021 to further prevent moisture and oxygen from passing through the first inorganic layer 102 and reaching the OLED array layer 104. The first inorganic layer 102 is a stacked layer of at least one silicon oxide layer 1021 and at least one silicon nitride layer 1022, so that the first inorganic layer 102 can adhere well to the flexible polymer substrate 101 and perform well for blocking moisture and oxygen at the same time, thereby preventing moisture and oxygen from passing through the first inorganic layer 102 and corroding the active cathode and organic light emitting materials of the OLED array layer 104.

The second inorganic layer 103 can be made of silicon oxide, silicon nitride, aluminum oxide, and other inorganic materials for blocking moisture and oxygen from entering the flexible polymer substrate 101.

More specifically, the OLED display panel 10 further comprises an organic layer 105. The organic layer 105 is formed on a side of the second inorganic layer 103 away from the flexible polymer substrate 101. Through formation of the organic layer 105 on the side of the first inorganic layer 10 away from the flexible polymer substrate 1012, a path for diffusing the moisture and oxygen to the OLED array layer 104 is increased. The first inorganic layer 102, the flexible polymer substrate 101, the second inorganic layer 103, and the organic layer 105 as a whole further improves the barrier property of the OLED display panel 10 against moisture and oxygen. The organic layer 105 is a polyimide (PI) layer. The polyimide layer has a light transmittance of greater than or equal to 90%. The polyimide layer is typically formed by imidizing a polyamic acid solution in a heating chamber after the polyamic acid solution is coated. A volume percentage of oxygen in the heating chamber is less than or equal to 100 ppm to make a light transmittance of the formed polyimide layer be greater than or equal to 90% and prevent the formed polyimide layer from turning yellow and causing low light transmittance, thereby affecting the receiving effect on optical signals of the optical sensor 20 at the side of the flexible polymer substrate 101. That is, once light transmittance of the polyimide layer is greater than or equal to 90%, it is advantageous for improving the reception of the optical signals by the optical sensor 20.

The second inorganic layer 103 comprises a stacked layer of a first silicon oxide layer 1031 and an amorphous silicon (α-Si) layer 1032. The amorphous silicon layer 1032 is disposed between the first silicon oxide 1031 and the organic layer 105. The first silicon oxide layer 1031 has a thickness of 450 nm to 550 nm. The first silicon oxide layer 1031 and the amorphous silicon layer 1032 both block moisture and oxygen, and the amorphous silicon layer 1032 further improves adhesion between the second inorganic layer 103 and the organic layer 105 at the same time.

Furthermore, the second inorganic layer 103 further comprises a silicon nitride layer (not shown) formed between the first silicon oxide layer 1031 and the amorphous silicon layer 1032 to further enhance blocking performance of the second inorganic layer 103 against moisture and oxygen, thereby further improving the barrier function of the OLED display panel 10 against moisture and oxygen.

The OLED array layer 104 comprises a plurality of organic light emitting diodes arranged in an array. The organic light emitting diodes comprise an anode, a cathode, and an organic light emitting material between the anode and the cathode. The organic light emitting material and the active metal in the cathode are sensitive to moisture and oxygen, and are easily corroded, resulting in malfunction of the organic light-emitting diodes and shortened service life of the electronic device.

The OLED display panel 10 further comprises an encapsulation layer 106. The encapsulation layer 106 is used to encapsulate the OLED array layer 104 to prevent the OLED array layer 104 from contacting with moisture and oxygen, which leads to shortened service life of the organic light emitting diode display panel and decreased service life of the electronic device. The encapsulation layer 106 comprises at least two inorganic layers and one organic layer between the two inorganic layers.

Referring to FIGS. 1 and 2 again, the OLED display panel 10 comprises at least one photosensitive region 100a. The photosensitive region 100a is used to dispose the optical sensor 20, and the optical sensor 20 receives optical signals and converts them into electrical signals after light is incident on the photosensitive region 100a. The OLED display panel 10 further comprises a display region 100b disposed at the periphery of the photosensitive region 100a. Specifically, there are a plurality of photosensitive regions 100a, and the plurality of photosensitive regions 100a are independent from each other, and the display region 100b is located at the periphery of the plurality of photosensitive regions 100a. A plurality of photosensitive regions 100a are located at one end of the OLED display panel 10. A shape of the plurality of photosensitive regions 100a is a circle, square, or other shapes. The optical sensor 20 is disposed in the photosensitive region 100a of the OLED display panel 10, and is disposed on a side of the organic layer 105 away from the flexible polymer substrate 101. Each of the photosensitive regions 100a is correspondingly disposed with at least one optical sensor 20. A vertical projection of the optical sensor 20 over the flexible polymer substrate 101 is within or overlaps the photosensitive region 100a.

It should be noted that the photosensitive region 100a of the OLED display panel 10 is a light transmitting region to ensure that an external light signal can reach the optical sensor 20. The photosensitive region 100a of the OLED display panel 10 is formed as a light-transmissive region by forming a hole in a film layer of the photosensitive region 100a. For example, the OLED array layer 104 of the photosensitive region 100a is removed to form a hole to prevent the optical signal from not being able to reach the optical sensor 20 due to light shielding of a metal layer in the OLED array layer 104.

Figure 3:
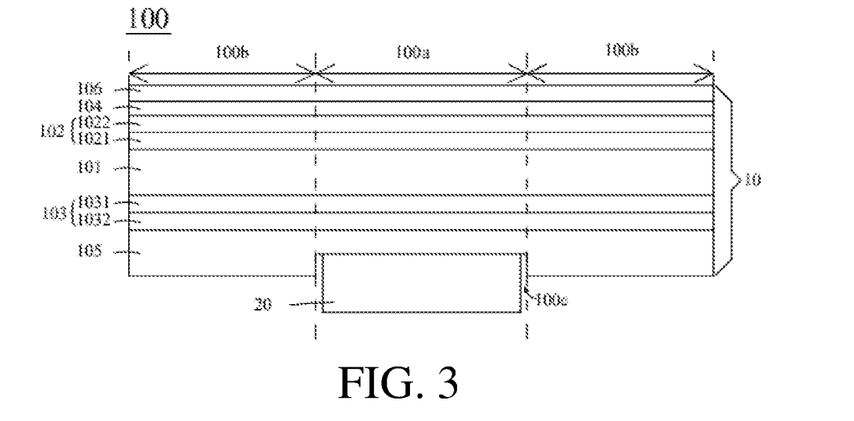
FIG. 3 is a second cross-sectional view along line A-A of the electronic device shown in FIG. 1.

Please refer to FIG. 3, which is a second cross-sectional view along the line A-A of the electronic device shown in FIG. 1. As shown in FIG. 3, the photosensitive region 100a of the OLED display panel 10 is provided with a recess 100c that penetrates at least a portion of the organic layer 105 along a first direction. The first direction is a direction of the organic layer 105 toward the flexible polymer substrate 101. The optical sensor 20 is disposed in the recess 100c, and a size of the optical sensor 20 along the first direction may be greater than the depth of the recess 100c along the first direction. In addition, the size of the optical sensor 20 along the first direction is less than or equal to the depth of the recess 100c along the first direction. More specifically, the recess 100c penetrates the portion of the organic layer 105 along the first direction, and the recess 100c is used to place the optical sensor 20, so that a height of the optical sensor 20 protruding over the OLED display panel 10 is thus reduced, thereby reducing the unevenness of the electronic device due to setting of the optical sensor 20, making the side where the optical sensor 20 receives the optical signal closer to the light incident surface of the OLED display panel 10, and allowing the optical sensor 20 to receive more optical signals due to reduction of the path that light passes to the optical sensor 20. A thickness of the recess 100c penetrating the organic layer 105 along the first direction depends on the size of the optical sensor 20.

Figure 4:
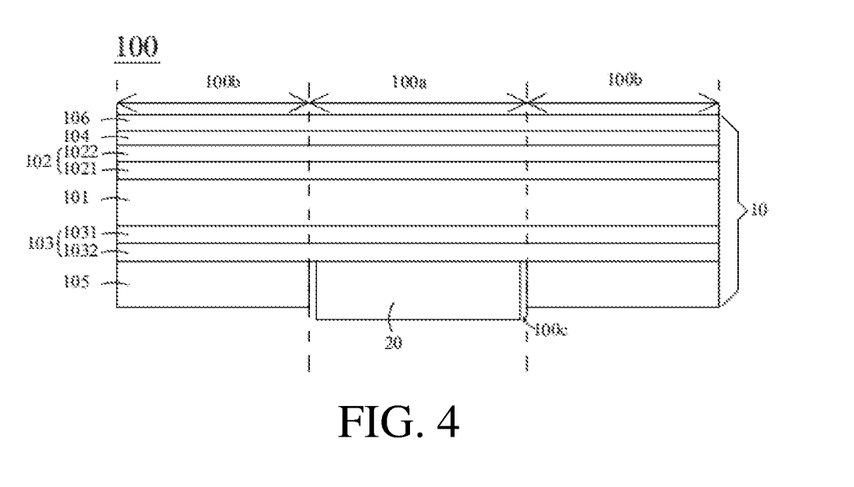
FIG. 4 is a third cross-sectional view along line A-A of the electronic device shown in FIG. 1.

Please refer to FIG. 4, which is a third cross-sectional view along the line A-A of the electronic device shown in FIG. 1. As shown in FIG. 4, the recess 100c may penetrate the entire organic layer 105 along the first direction to further reduce the unevenness of the electronic device due to disposing of the optical sensor 20 on the light-emitting backside surface of the OLED display panel 10, and further improve the optical signal receiving performance of the optical sensor 20.

Figure 5:
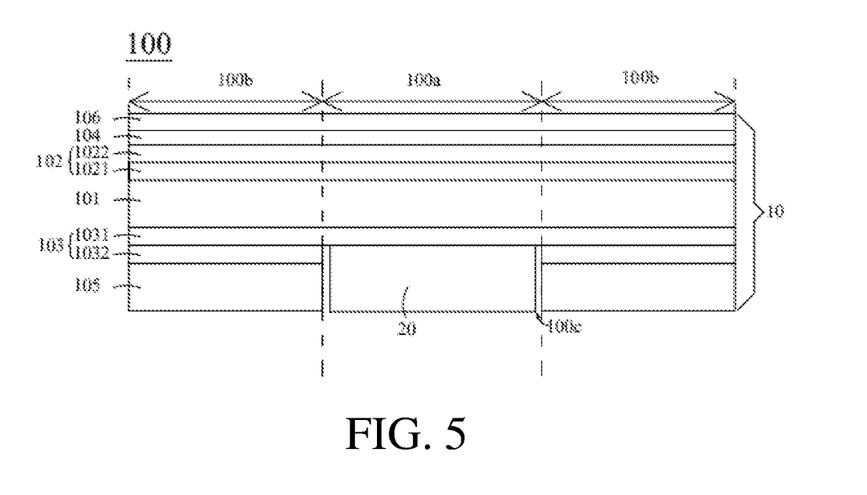
FIG. 5 is a fourth cross-sectional view along line A-A of the electronic device shown in FIG. 1.

Please refer to FIG. 5, which is a fourth cross sectional view along the line A-A of the electronic device shown in FIG. 1. The recess 100c penetrates the entire organic layer 105 and a portion of the second inorganic layer 103 along the first direction. More specifically, when the second inorganic layer is formed of the first silicon oxide layer 1031 and an amorphous silicon layer 1032 and the amorphous silicon layer 1032 is between the first silicon oxide layer 1031 and the organic layer 105, the recess 100c penetrates the entire organic layer 105 and the amorphous silicon layer 1032 in the second inorganic layer 103 along the first direction to ensure that the OLED display panel 10 can block moisture and oxygen and further reduce unevenness in the electronic device due to disposing of the optical sensor 20 on the light emitting backside surface of the OLED display panel 10.

When the second inorganic layer 103 is formed of the first silicon oxide layer 1031, the amorphous silicon layer 1032, and the silicon nitride between the first silicon oxide 1031 and the amorphous silicon 1032, and the amorphous silicon layer 1032 is located on the side close to the organic layer 105, the recess 100c penetrates the entire organic layer 105 and the amorphous silicon layer 1032 and the silicon nitride layer in the second inorganic layer 103 along the first direction.

Figure 6:
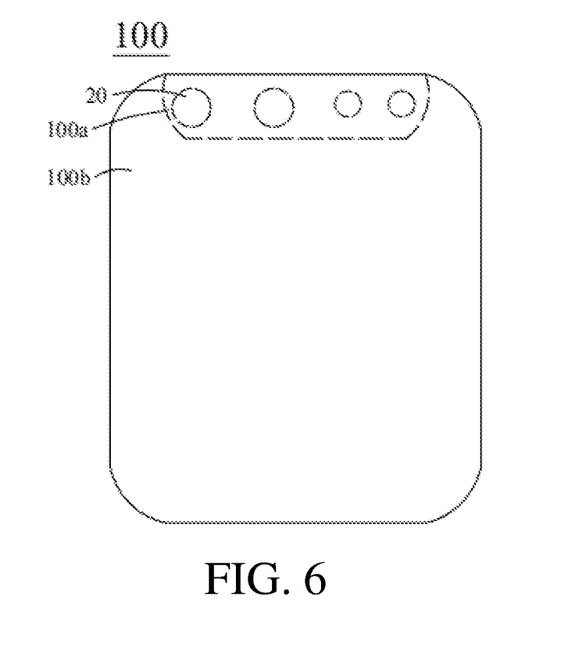
FIG. 6 is a schematic plan view of an electronic device according to a second embodiment of the present application.

Please refer to FIG. 6, which is a schematic plan view of an electronic device according to a second embodiment of the present application. The electronic device 100 shown in FIG. 6 is basically similar to the electronic device 100 shown in FIG. 1, except that a photosensitive region 100a is disposed at one end of an OLED display panel 10, there is one photosensitive region 100a, the photosensitive region 100a is U-shaped, and a display region 100b is located at a periphery of the photosensitive region 100a. A plurality of optical sensors 20 are disposed in the photosensitive region 100a. The photosensitive region 100a of the OLED display panel 10 is formed with a recess 100c, and a vertical projection of the recess 100c on a flexible polymer substrate 101 exactly overlaps the photosensitive region 100a. The recess 100c penetrates at least a portion of an organic layer 105 along a direction in which the organic layer 105 faces the flexible polymer substrate 101.

Figure 7:
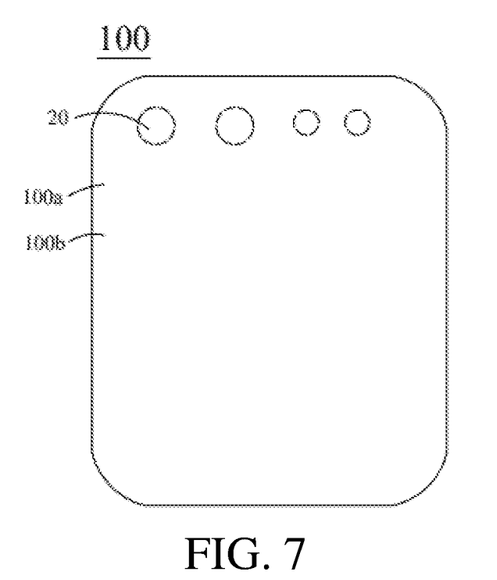
FIG. 7 is a schematic plan view of an electronic device according to a third embodiment of the present application.

Please refer to FIG. 7, which is a schematic plan view of an electronic device according to a third embodiment of the present application. An electronic device 100 shown in FIG. 7 is basically similar to the electronic device 100 shown in FIG. 1, except that a photosensitive region 100a completely overlaps a display region 100b, and an optical sensor 20 is disposed at one end of an OLED display panel 10 and is located in a photosensitive region 100a. The photosensitive region 100a of the OLED display panel 10 is formed with a recess 100c penetrating at least a portion of an organic layer 105 along a direction in which the organic layer 105 faces a flexible polymer substrate 101. The recess 100c is disposed with a camera and an infrared sensor, or the like therein. A plurality of touch elements is further disposed in the recess 100c. The touch elements may be infrared light emitting and receiving sensing elements, and the touch elements may also be ultrasonic transmitters and corresponding ultrasonic receivers, so that the display region 100b of the electronic device 100 has display function, touch function and light transmission function. The photosensitive region 100a of the OLED display panel 10 is formed with the recess 100c, and a vertical projection of the recess 100c on the flexible polymer substrate 101 exactly overlaps the photosensitive region 100a.

Figure 8:
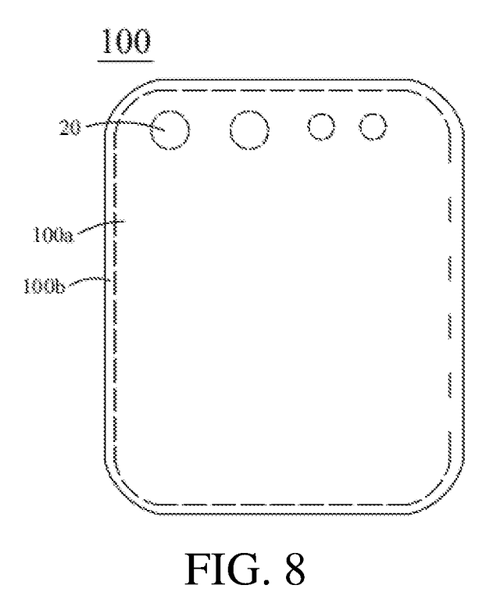
FIG. 8 is a schematic plan view of an electronic device according to a fourth embodiment of the present application.

Please refer to FIG. 8, which is a schematic plan view of an electronic device according to a fourth embodiment of the present application. An electronic device 100 shown in FIG. 8 is basically similar to the electronic device 100 shown in FIG. 7, except that a photosensitive region 100a partially overlaps a display region 100b, and the photosensitive region 100a is disposed in the display region 100b, that is, the display region 100b is larger than the photosensitive region 100a.

Based on the same inventive concept, the present application further provides an organic light emitting diode display panel comprising a flexible polymer substrate, a first inorganic layer, a second inorganic layer, and an organic light emitting diode array layer; the first inorganic layer and the second inorganic layer formed over opposite surfaces of the flexible polymer substrate, and the organic light emitting diode array layer formed on a side of the first inorganic layer away from the flexible polymer substrate.

The organic light emitting diode display panel of the present application respectively forms an inorganic layer on opposite surfaces of the flexible polymer substrate, and the flexible polymer substrate and the inorganic layer on the opposite surfaces thereof as a whole have high barrier properties against moisture and oxygen. Moisture and oxygen can be prevented from corroding active cathode and the organic light emitting layer of the organic light emitting diode array layer, thereby improving the service life of the organic light emitting diode display panel.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An electronic device, comprising an organic light emitting diode (OLED) display panel, wherein the OLED display panel comprises a flexible polymer substrate, a first inorganic layer, a second inorganic layer, an organic layer, and an OLED array layer; and the first inorganic layer and the second inorganic layer formed over opposite surfaces of the flexible polymer substrate, the organic layer is formed on a side of the second inorganic layer away from the flexible polymer substrate, and the OLED array layer formed on a side of the first inorganic layer away from the flexible polymer substrate; and wherein the first inorganic layer comprises a stacked layer of at least one second silicon oxide layer and at least one silicon nitride layer, and the at least one second silicon oxide layer located on one side adjacent to the flexible polymer substrate; and the second inorganic layer comprises a stacked layer of a first silicon oxide layer and an amorphous silicon layer, and the amorphous silicon layer disposed between the first silicon oxide layer and the organic layer.

2. The electronic device of claim 1, wherein the OLED display panel comprises at least one photosensitive region, the at least one photosensitive region of the OLED display panel formed with a recess, and the recess penetrates a portion of the organic layer along a first direction that is a direction in which the organic layer faces the flexible polymer substrate.

3. The electronic device of claim 2, wherein the recess penetrates through entire organic layer along the first direction, or the recess penetrates through the entire organic layer and a portion of the second inorganic layer along the first direction.

4. The electronic device of claim 2, wherein the electronic device further comprises an optical sensor disposed in the recess, and the optical sensor has a size along the first direction that is less than or equal to a depth of the recess along the first direction.

5. The electronic device of claim 2, wherein the OLED display panel further comprises a display region, and the display region is disposed at a periphery of the photosensitive region, or the photosensitive region overlaps the display region.

6. The electronic device of claim 1, wherein the flexible polymer substrate and the organic layer are both polyimide layers, and the polyimide layers have a light transmittance greater than or equal to 90%.

7. The electronic device of claim 6, wherein the polyimide layers are formed by imidizing a polyamic acid solution in a heating chamber after coating the polyamic acid solution, and a volume percentage of oxygen in the heating chamber is less than or equal to 100 ppm.

8. An organic light emitting diode (OLED) display panel, comprising:
a flexible polymer substrate;
a first inorganic layer;
a second inorganic layer;
an organic layer; and
an OLED array layer;
wherein the first inorganic layer and the second inorganic layer formed on opposite surfaces of the flexible polymer substrate, the organic layer is formed on a side of the second inorganic layer away from the flexible polymer substrate, and the OLED array layer formed on a side of the first inorganic layer away from the flexible polymer substrate,
wherein the first inorganic layer comprises a stacked layer of at least one second silicon oxide layer and at least one silicon nitride layer, wherein the at least one second silicon oxide layer located on one side adjacent to the flexible polymer substrate; and
the second inorganic layer comprises a stacked layer of a first silicon oxide layer and an amorphous silicon layer, and the amorphous silicon layer disposed between the first silicon oxide layer and the organic layer.

9. The OLED display panel of claim 8, further comprising at least one photosensitive region, and the at least one photosensitive region of the OLED display panel formed with a recess, and the recess penetrates at least a portion of the organic layer along a first direction that is a direction in which the organic layer faces the flexible polymer substrate.

10. The OLED display panel of claim 9, wherein the recess penetrates the entire organic layer along the first direction, or the recess penetrates the entire organic layer and a portion of the second inorganic layer along the first direction.

11. The OLED display panel of claim 9, further comprising a display region, wherein the display region is disposed at a periphery of the photosensitive region, or the photosensitive region overlaps the display region.

12. The OLED display panel of claim 8, wherein the flexible polymer substrate and the organic layer are both polyimide layers, and the polyimide layers have a transmittance greater than or equal to 90%.

13. The OLED display panel of claim 12, wherein the polyimide layers are formed by imidizing a polyamic acid solution in a heating chamber after the polyamic acid solution is coated, and a volume percentage of oxygen in the heating chamber is less than or equal to 100 ppm.

* * * * *